(12) United States Patent
Minamihaba et al.

(10) Patent No.: US 6,896,590 B2
(45) Date of Patent: May 24, 2005

(54) CMP SLURRY AND METHOD FOR MANUFACTURING A SEMICONDUCTOR DEVICE

(75) Inventors: Gaku Minamihaba, Kawasaki (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 284 days.

(21) Appl. No.: 10/197,602

(22) Filed: Jul. 18, 2002

(65) Prior Publication Data

US 2003/0017786 A1 Jan. 23, 2003

(30) Foreign Application Priority Data

Jul. 18, 2001 (JP) ........................................ 2001-218531

(51) Int. Cl.$^7$ ................................................ B24B 1/00
(52) U.S. Cl. ............................ 451/41; 451/28; 451/36
(58) Field of Search ............................. 451/41, 36, 28; 51/307, 308, 309; 438/690, 692, 693

(56) References Cited

U.S. PATENT DOCUMENTS

| | | | |
|---|---|---|---|
| 5,264,010 A | | 11/1993 | Brancaleoni et al. |
| 6,447,371 B2 | * | 9/2002 | Brusic Kaufman et al. ... 451/36 |
| 6,695,682 B2 | * | 2/2004 | Sato et al. ..................... 451/8 |
| 2002/0173243 A1 | * | 11/2002 | Costas et al. .................. 451/41 |
| 2003/0171075 A1 | * | 9/2003 | Nihonmatsu et al. ......... 451/41 |

FOREIGN PATENT DOCUMENTS

JP          2000-269169          9/2000

OTHER PUBLICATIONS

Yano et al., U.S. Appl. No. 09/531,163, "Aqueous Dispersion, Aqueous Dispersion for Chemical Mechanical Polishing Used For Manufacture Of Semiconductor Devices, Method For Manufacture of Semiconductor Devices, And Method For Formation Of Embedded Wiring", filed Mar. 17, 2000.

Minamihaba et al., U.S. Appl. No. 09/527,600, "Slurry For CMP and CMP Method", filed Mar. 17, 2000.

* cited by examiner

*Primary Examiner*—Lee D. Wilson
(74) *Attorney, Agent, or Firm*—Finnegan, Henderson, Farabow, Garrett & Dunner, L.L.P.

(57) ABSTRACT

Disclosed is a CMP slurry, comprising a dispersion containing first particles having a primary particle diameter falling within a range of 5 nm to 50 nm and second particles having a primary particle diameter falling within a range of 50 nm to 100 nm, the concentration of the first particles in the dispersion falling within a range of 0.5 to 5% by weight, and the concentration of the second particles in the dispersion falling within a range of 0.01 to 0.1% by weight.

20 Claims, 3 Drawing Sheets

CMP SLURRY AND METHOD FOR MANUFACTURING A SEMICONDUCTOR DEVICE

CROSS-REFERENCE TO RELATED APPLICATIONS

This application is based upon and claims the benefit of priority from the prior Japanese Patent Application No. 2001-218531, filed Jul. 18, 2001, the entire contents of which are incorporated herein by reference.

BACKGROUND OF THE INVENTION

1. Field of the Invention

The present invention relates to a method for manufacturing a semiconductor device, particularly a slurry for the CMP (Chemical Mechanical Polishing) technology for forming a damascene wiring such as Al, Cu or W, which is mounted on a DRAM or a high-speed logic LSI, and to a method for manufacturing a semiconductor device using the CMP slurry.

2. Description of the Related Art

Nowadays, the CMP process is said to be a process absolutely required in the field of manufacturing an LSI. In the step of forming a wiring, it is very difficult to carry out the processing of a Cu layer or a metal layer having a thickness not smaller than 1 $\mu$m, particularly the processing of an Al layer, by the conventional RIE (Reactive Ion Etching) process. In other words, it is difficult nowadays to employ the conventional method for forming the wiring structure that is indispensable for next-generation LSIs.

In order to overcome the difficulties noted above, vigorous research is being carried out in an attempt to improve the buried (damascene) wiring process using CMP technology.

Nowadays, it is required to suppress the erosion as much as possible and to carry out a CMP process low in defects in CMP technology. This has been derived from the situation that the design rule of the wiring has become small. For example, the wiring width for the next generation of devices is about 0.1 $\mu$m, which is substantially equal to or smaller than the size of the conventional abrasive particle.

Since, for example, a scratch generated during the CMP process is dependent on the particle size, it is necessary to use abrasive particles as small as possible in order to suppress the scratches generated during the CMP process. Also, it is effective to use particles having a small particle size for suppressing erosion. To be more specific, it was attempted in the past to carry out the CMP process by using abrasive particles having a small primary particle diameter, which is not larger than 50 nm, and dispersed in the dispersion medium in the form of the primary particles so as not to form secondary aggregated particles having a diameter of 0.2 $\mu$m or more within the dispersion medium.

However, it is difficult to control the primary particle size of the abrasive particles in the case where the abrasive particles have a small diameter and to control the diameter of the secondary particles formed by aggregation of the primary abrasive particles. Even if it were possible to control the particle diameter, the controlled particle size fails to fit the surface state of the polishing pad used nowadays, resulting in failure to obtain a sufficiently high polishing rate.

BRIEF SUMMARY OF THE INVENTION

A CMP slurry according to one aspect of the present invention comprises a dispersion containing first particles having a primary particle diameter falling within a range of 5 nm to 50 nm and second particles having a primary particle diameter falling within a range of 50 nm to 100 nm, the concentration of the first particles in the dispersion falling within a range of 0.5 to 5% by weight, and the concentration of the second particles in the dispersion falling within a range of 0.01 to 0.1% by weight.

A CMP slurry according to another aspect of the present invention comprises a dispersion containing abrasive particles having a primary particle diameter falling within a range of 5 nm to 50 nm and including at least one material selected from the group consisting of colloidal silica, colloidal alumina, colloidal titanium oxide, colloidal ceria and colloidal zirconia, and assist particles having a primary particle diameter falling within a range of 50 nm to 100 nm and including at least one material selected from the group consisting of ceria and zirconia, the concentration of the abrasive particles in the dispersion falling within a range of 0.5 to 5% by weight, and the concentration of the assist particles in the dispersion falling within a range of 0.01 to 0.1% by weight.

A method for manufacturing a semiconductor device according to one aspect of the present invention comprises:

forming an insulating film above a semiconductor substrate;

forming a concave portion in the insulating film;

depositing a conductive material inside the concave portion and on the insulating film so as to form a conductive layer; and removing the conductive material deposited on the insulating film so as to expose the surface of the insulating film while allowing the conductive material to remain inside the concave portion, wherein the removal of at least a part of the conductive material deposited on the insulating film is performed by a CMP process using a slurry comprising a dispersion containing first particles having a primary particle diameter falling within a range of 5 nm to 50 nm and second particles having a primary particle diameter falling within a range of 50 nm to 100 nm, the concentration of the first particles in the dispersion falling within a range of 0.5 to 5% by weight, and the concentration of the second particles in the dispersion falling within a range of 0.01 to 0.1% by weight.

A method for manufacturing a semiconductor device according to another aspect of the present invention comprises:

forming an insulating film above a semiconductor substrate;

forming a concave portion in the insulating film;

depositing a conductive material inside the concave portion and on the insulating film so as to form a conductive layer; and removing the conductive material deposited on the insulating film so as to expose the surface of the insulating film while allowing the conductive material to remain inside the concave portion, wherein the removal of at least a part of the conductive material deposited on the insulating film is performed by a CMP process using a slurry comprising a dispersion containing abrasive particles having a primary particle diameter falling within a range of 5 nm to 50 nm and including at least one material selected from the group consisting of colloidal silica, colloidal alumina, colloidal titanium oxide, colloidal ceria and colloidal zirconia, and assist particles having a primary particle diameter falling within a range of 50 nm to 100 nm and including at least one material selected from the group consisting of ceria and zirconia, the concentration of the abrasive particles in the dispersion falling within a range of 0.5 to 5% by weight, and the concentration of the assist particles in the dispersion falling within a range of 0.01 to 0.1% by weight.

DETAILED DESCRIPTION OF THE INVENTION

Figure 1A:
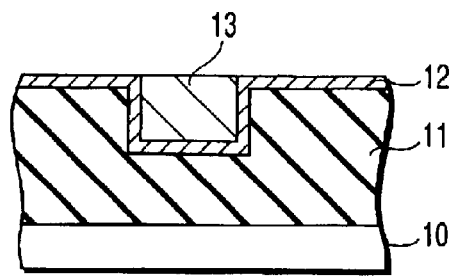
FIGS. 1A and 1B are cross-sectional views collectively showing a method for manufacturing a semiconductor device according to one embodiment of the present invention.

The present inventors have found that it is possible to obtain a slurry capable polishing a metal layer at a sufficiently high polishing rate by mixing at specified concentrations abrasive particles that can be activated and reduces in particle diameter upon receipt of a CMP stress and assist particles assisting the reduction in particle diameter of the abrasive particles.

In the CMP slurry according to one embodiment of the present invention, the abrasive particles for polishing the substrate to be processed are formed of a material selected from the group consisting of colloidal silica, colloidal alumina, colloidal titanium oxide, colloidal ceria, colloidal zirconia, a mixture thereof, and a mixed crystal thereof. The primary particle diameter of the abrasive particles should be not larger than 50 nm, and the lower limit in the primary particle diameter of the abrasive particles should be 5 nm. If the primary particle diameter of the abrasive particles is smaller than 5 nm, it is difficult to ensure a sufficiently high polishing rate. On the other hand, if the primary particle diameter exceeds 50 nm, the performance of the abrasive particles is lowered in respect of the occurrence of scratches and erosion.

The abrasive particles are activated chemically or mechanically by assist particles. Also, the particle diameter of the abrasive particles is decreased chemically or mechanically by the assist particles. It is possible for the assist particles to be formed of at least one material selected from the group consisting of ceria and zirconia. Any of a colloidal material and a fumed material can be used for forming the assist particles. Also, the primary particle diameter of the assist particles should fall within a range of 50 nm to 100 nm. It should be noted in this connection that the upper limit of the primary particle diameter of the abrasive particles is 50 nm as described above. Therefore, if the primary particle diameter of the assist particles is smaller than 50 nm, it is impossible for the assist particles to produce the effect of decreasing the particle diameter of the abrasive particles. On the other hand, if the primary particle diameter of the assist particles exceeds 100 nm, the assist particles themselves perform the function of the abrasive particles, with the result that the particle diameter of the original abrasive particles cannot be decreased. In other words, if the primary particle diameter of the assist particles falls within a range of 50 nm to 100 nm, the assist particles produce a satisfactory function together with the polishing pad so as to activate the abrasive particles and decrease the particle diameter of the abrasive particles.

It is possible prepare a CMP slurry according to one embodiment of the present invention by dispersing in an optional combination the abrasive particles and the assist particles described above in a dispersion medium such as water or an organic solvent.

In order to ensure a practical polishing rate, the concentration of the abrasive particles in the dispersion should fall within a range of 0.5 to 5% by weight. If the concentration of the abrasive particles is lower than 0.5% by weight, a large number of abrasive particles are buried in the concave portions in the irregular surface of the polishing pad so as to decrease the number of abrasive particles acting on, for example, a metal layer to be polished having a conductivity. As a results it is impossible to obtain a sufficiently high polishing rate. On the other hand, if the concentration of the abrasive particles exceeds 5% by weight, the abrasive particles are locally accumulated on, for example, a metal layer under polishing so as to promote the erosion problem.

On the other hand, the concentration of the assist particles in the dispersion should fall within a range of 0.01 to 0.1% by weight. If the concentration of the assist particles is lower than 0.01% by weight, the number of assist particles acting on the abrasive particles so as to decrease the particle diameter of the abrasive particles is small, resulting in failure to ensure a sufficiently high polishing rate. On the other hand, if the concentration of the assist particles exceeds 0.1% by weight, it is impossible to polish selectively the target material to be polished, e.g., a layer having a conductivity.

The mixing ratio of the abrasive particles to the assist particles is not particularly limited. A desired effect can be obtained as far as the concentrations of the abrasive particles and the assist particles in the dispersion fall within the ranges described above.

The CMP slurry according to one embodiment of the present invention, which contains in specified concentrations the abrasive particles and the assist particles each having the primary particle diameters falling within the specified ranges, can be suitably used for the CMP process for forming a damascene wiring by burying a conductive material in a groove formed in an insulating film. It is possible for the conductive layer that can be polished by the CMP process using the slurry according to one embodiment of the present invention to contain a liner material and a wiring material. The slurry according to one embodiment of the present invention is particularly suitable for use for the polishing of the liner material.

It is possible for the conductive layer to contain Cu, Al, W, Ti, Mo, Nb, Ta, V, Ru, Ag, an alloy containing these metals as main components as well as a nitride, boride or oxide of these metals. Also, it is possible for the conductive layer to be a film of a single layer structure or a film of a laminate structure formed of these materials.

Some embodiments of the present invention will now be described more in detail with reference to the accompanying drawings.

Embodiment 1 (Silica-Ceria):

This embodiment is directed to an example in which a slurry of Embodiment 1 of the present invention containing abrasive particles formed of colloidal silica and assist particles formed of colloidal ceria is applied to the touch-up of a Cu-CMP.

Figure 1B:
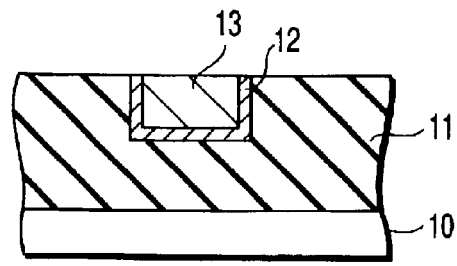

FIGS. 1A and 1B are cross-sectional views collectively showing the process of forming a Cu damascene wiring.

In the first step, an insulating film 11 containing, for example, a silicon oxide-based material or a low-k material is formed on a semiconductor substrate 10, followed by forming a groove having a depth of 800 nm in the insulating film 11. Incidentally, it is possible for the semiconductor substrate 10 to be a bulk substrate or an SOI substrate, and an integrated circuit (not shown) is formed on the substrate 10. Then, a TaN liner 12 is formed on the insulating film 11 and a Cu film 13 is formed on the TaN liner 12 by a sputtering method (seed layer) and a plating method.

In the next step, the undesired portion of the Cu film 13 is removed by a CMP process so as to expose the TaN liner 12 to the outside, as shown in FIG. 12A. It should be noted that the erosion can be suppressed by using the TaN liner 12 for stopping the polishing, with the result that it is possible to suppress the damage done to the insulating film 11 even if the insulating film 11 is formed of, for example, a low-k material in which defects tend to occur (i.e., an insulating material having a relative dielectric constant not larger than 3.0).

Figure 2:
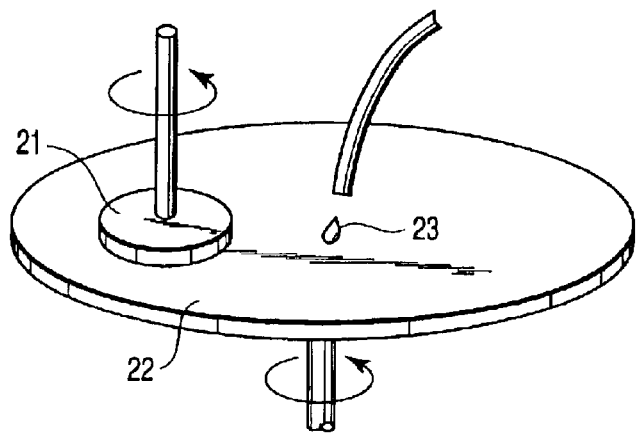
FIG. 2 schematically shows the construction of a polishing apparatus used in the embodiment of the present invention.

FIG. 2 schematically shows the construction of the polishing apparatus used for the CMP process. As shown in the drawing, a polishing pad 22 is mounted on a table rotated at, for example, about 100 rpm. A slurry 23 is dripped onto the polishing pad 22 at a rate of, for example, 200 ml/min. At the same time, a top ring 21 holding a wafer is pressed against the pad 22 while rotating the top ring 21 at 100 rpm so as to polish the undesired portion of the Cu film 13.

The slurry 23 used for the CMP process is formed of a dispersion prepared by dispersing 1% by weight of ammonium persulfate used as an oxidizing agent, 0.5% by weight of quinaldic acid used as an oxidation suppressing agent, 1% by weight of silica used as the abrasive particles, and 0.4% by weight of KOH used as a pH adjusting agent in water, and the polishing is performed for 3 minutes by using a IC1000-pad manufactured by Rodel, Inc. as the polishing pad 22.

Then, the undesired portion of the TaN liner 12 is removed by a method equal to that described above, except that the slurry for this embodiment is used for removing the undesired portion of the TaN liner 12.

The slurry for this embodiment was a slurry prepared by dispersing colloidal silica having a primary particle diameter of 50 nm and ceria particles having a primary particle diameter of 100 nm in pure water. The concentrations of the colloidal silica and the ceria particles were 5% by weight and 0.05% by weight, respectively. When the TaN liner 12 was polished by using the slurry, the polishing rate of the TaN liner 12 was found to be markedly high, i.e., as high as 43 nm/min.

Figure 3A:
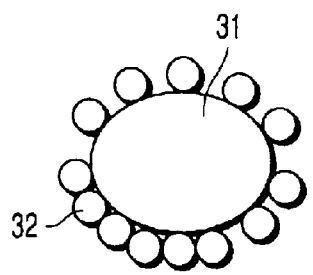
FIGS. 3A and 3B collective show schematically the functions of the abrasive particles and the assist particles contained in the slurry according to one embodiment of the present invention.
Figure 3B:
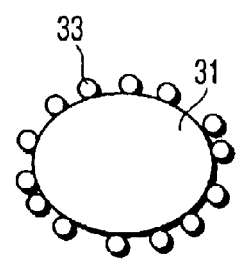

The high polishing rate thus achieved will now be described with reference to FIGS. 3A and 3B. Specifically, in the dispersion, the colloidal silica particles 32 that are charged negative are adsorbed on the surface of the ceria particles 31 that are charge positive because of the presence of the zeta potential, as shown in FIG. 3A. Since the ceria particles are originally particles that polish the silica ($SiO_2$) particles, a reaction between the ceria particles and the silica particles takes place upon application of the CMP stress. As a result, the silica particles 32 are activated and the particle diameter of the silica particles 32 is decreased so as to form silica particles 33 having a small particle diameter, as shown in FIG. 3B. In this fashion, silica particles 33 having an ideal particle diameter and present in a dispersed state are pressed against the TaN liner that is to be polished so as to make it possible to polish the TaN liner with a sufficiently high polishing rate.

It should also be noted that the ceria particles used have a large primary particle diameter of 100 nm and, thus, produce a satisfactory mutual function with the pad. As a result, it is considered reasonable to understand that the polishing efficiency of the colloidal silica particles present on the surface of the ceria particles is increased so as to provide a factor of a high polishing rate of the TaN liner.

Incidentally, in the touch-up process described above, it is desirable for the TaN polishing rate to be about 40 nm/min (specifically, 40±10 nm/min) and for the $SiO_2$ polishing rate to be about 20 nm/min (specifically, 20±10 nm/min). Also, it is necessary to carry out the polishing by using particles having a small particle diameter in order to avoid the generation of scratches in the underlying layer positioned below the target layer to be polished.

Figure 4:
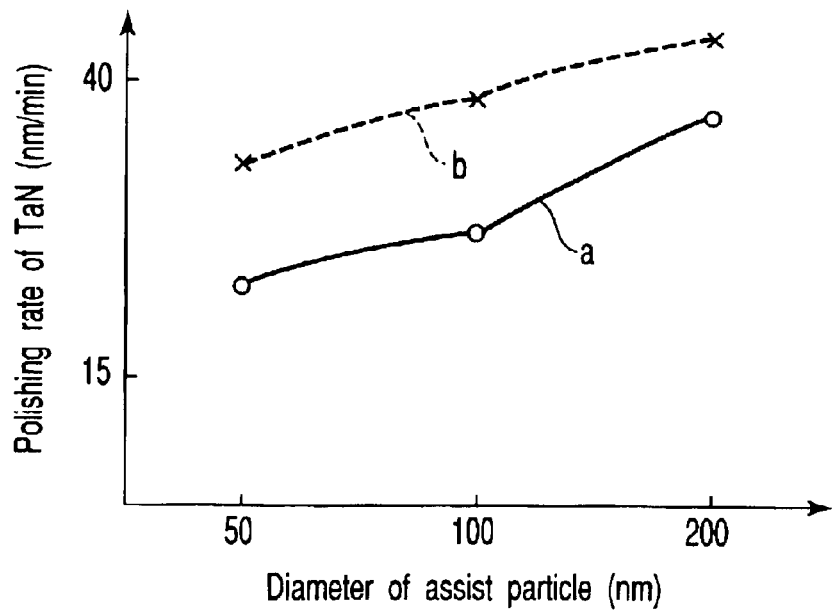
FIG. 4 is a graph showing the relationship between the primary particle diameter of the assist particles and the polishing rate of a TaN layer.

FIG. 4 is a graph showing the relationship between the TaN polishing rate and the primary particle diameter of the assist particles, covering the case where used is a dispersion in which colloidal silica used as the abrasive particles and ceria particles used as the assist particles are dispersed in water used as dispersion medium. Incidentally, the colloidal silica had a primary particle diameter of 50 nm and the concentration of the colloidal silica in the dispersion was 5% by weight. On the other hand, the primary particle diameter of the ceria particles was changed within a range of 50 nm to 200 nm. Also, the concentration of the ceria particles in the dispersion was set at 0.01% by weight or 0.1% by weight. Curves "a" and "b" shown in the graph of FIG. 4 cover the cases where the concentrations of the ceria particles in the dispersion were set at 0.01% by weight and 0.1% by weight, respectively.

Incidentally, the TaN polishing rate is 2.8 nm/min in the case where the dispersion contains silica particles alone, said silica particles having a primary particle diameter of 50 nm, in a concentration of 5% by weight. On the other hand, the TaN polishing rate is 4.5 nm/min in the case where the dispersion contains ceria particles alone, said ceria particles having a primary particle diameter of 100 nm, in a concentration of 0.05% by weight. What should be noted is that it is impossible to obtain a practical polishing rate in the case of using the silica particles or the ceria particles singly. On the other hand, the slurry according to the this embodiment of the present invention makes it possible to polish the TaN layer at a practical polishing rate, as shown in FIG. 4.

Figure 5:
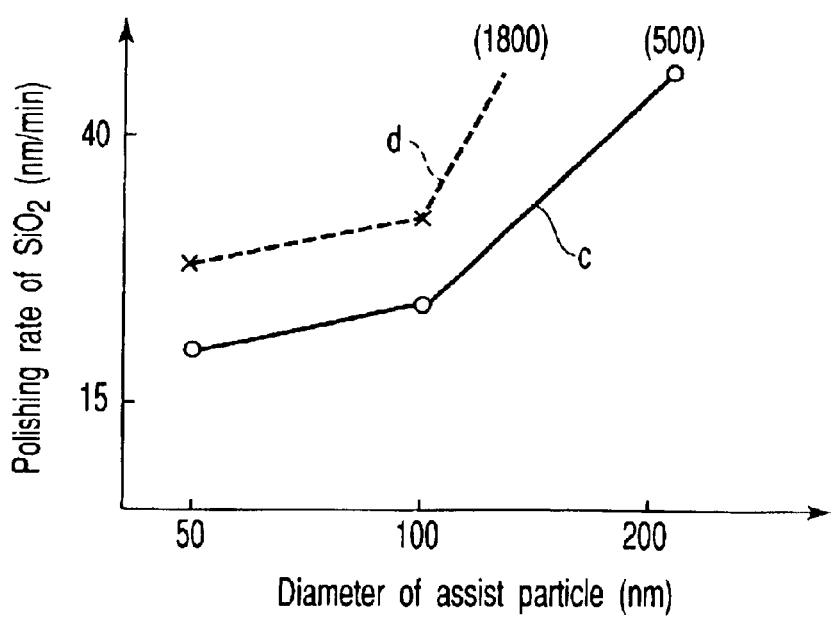
FIG. 5 is a graph showing the relationship between the primary particle diameter of the assist particles and the polishing rate of an $SiO_2$ layer.

FIG. 5 is a graph showing the relationship between the $SiO_2$ polishing rate and the particle diameter of the assist particles, covering the case where used is a dispersion containing colloidal silica used as the abrasive particles and ceria particles used as the assist particles. In this case, the colloidal silica had a primary particle diameter of 50 nm and the concentration of the colloidal silica in the dispersion was 5% by weight. On the other hand, the primary particle diameter of the ceria particles was changed within a range of 50 nm to 200 nm. Also, the concentration of the ceria particles in the dispersion was set at 0.01% by weight or 0.1% by weight. Curves "c" and "d" shown in the graph of FIG. 5 cover the cases where the concentrations of the ceria particles in the dispersion were set at 0.01% by weight and 0.1% by weight, respectively. Incidentally, the polishing rate of the $SiO_2$ layer is 8 nm/min in the case where the dispersion contains silica particles alone, said silica particles having a primary particle diameter of 50 nm, in a concentration of 5% by weight. On the other hand, the polishing rate of the $SiO_2$ layer is 11 nm/min in the case where the dispersion contains ceria particles alone, said ceria particles having a primary particle diameter of 100 nm, in a concentration of 0.05% by weight. Further, the polishing rate of the $SiO_2$ layer was about 20 nm/min in the case where the dispersion contained 5% by weight of colloidal silica having a primary particle diameter of 5 nm and 0.01% by weight of ceria particles having a primary particle diameter of 50 nm, though this case is not shown in the graph of FIG. 5.

As shown in the graph of FIG. 5, the polishing rate of the $SiO_2$ layer is rendered excessively high if the particle diameter of the assist particles exceeds 100 nm. The polishing rate of the $SiO_2$ is also rendered excessively high if the concentration of the assist particles exceeds 0.1% by weight, with the result that the $SiO_2$ layer between the adjacent damascene wirings are eliminated so as to generate an irregularity. What should be noted is that metal are accumulated in the concave portions of the irregularity in the case of forming multi-layered damascene wirings so as to bring about short-circuiting between the adjacent wirings and between the adjacent conductive layers. Under the circumstances, it is necessary for the concentration of the ceria particles used as the assist particles to be not higher than 0.1% by weight.

Embodiment 1 described above is directed to a CMP slurry containing colloidal silica particles used as the abrasive particles and ceria particles used as the assist particles. The primary particle diameter and the concentration of each of the abrasive particles and the assist particles are defined in embodiment 1 of the present invention. It has been made possible to form a Cu damascene wiring low in erosion and free from scratches by removing the TaN liner by the CMP process using the CMP slurry specified in embodiment 1 of the present invention. A similar effect can be obtained also in the case where fumed ceria particles are used as the assist particles.

Incidentally, a silica-ceria series CMP slurry is disclosed in Japanese Published Patent Application No. 7-502778. The CMP slurry disclosed in this prior art contains at least 3% by weight of ceria particles having a primary particle diameter of 50 nm, which permit a high polishing rate of an $SiO_2$ layer. In this case, the polishing rate of the $SiO_2$ layer is 200 nm/min, which is excessively high. Also, the silica particles prepared by the fumed method tend to be aggregated easily so as to form large secondary particles, and are nonuniform in the shape of the particles. It follows that the generation of scratches in the underlying layer (e.g., an insulating film) positioned below the target layer to be polished is a concern in the case of using the silica-ceria mixed CMP slurry disclosed in the prior art quoted above. At any rate, it is impossible to apply the silica-ceria mixed CMP slurry noted above to the touch-up process.

Embodiment 2 (Silica-Zirconia):

This embodiment is directed to an example in which a CMP slurry of Embodiment 2 of the present invention containing colloidal silica particles used as the abrasive particles and colloidal zirconia particles used as the assist particles is applied to the touch-up of a W-CMP.

Figure 6B:
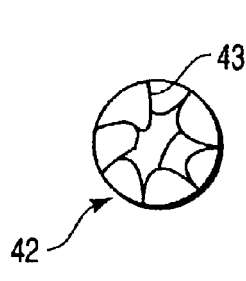
FIGS. 6A and 6B show the functions performed by the abrasive particles and the assist particles contained in the slurry according to another embodiment of the present invention.
Figure 6A:
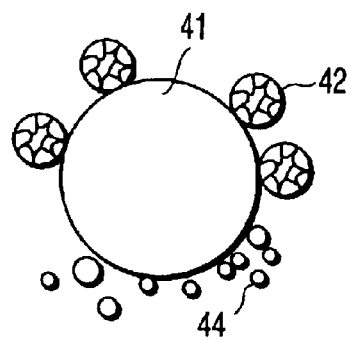

First of all, the functions produced by the particles contained in the CMP slurry of this embodiment will now be described with reference to FIGS. 6A and 6B. As shown in FIG. 6A, colloidal silica particles 42 are adsorbed on the surface of a zirconia particle 41. Also, as shown in a magnified fashion in FIG. 6B, fine pores 43 are present inside the colloidal silica particle 42 and, thus, the colloidal silica particle 42 is crushed upon receipt of the CMP stress so as to generate silica particles 44 having a small particle diameter, as shown in FIG. 6A. Since the silica particles 44 have an ideal particle diameter and are present in an ideally dispersed state, the polishing rate of the target layer to be polished is increased.

Figure 7A:
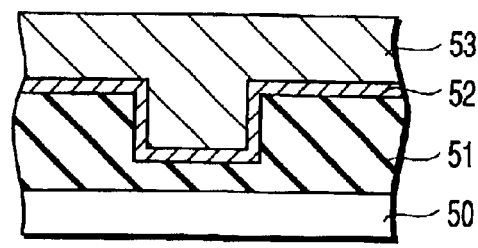
FIGS. 7A to 7C are cross-sectional views collectively showing a method for manufacturing a semiconductor device according to another embodiment of the present invention.
Figure 7B:
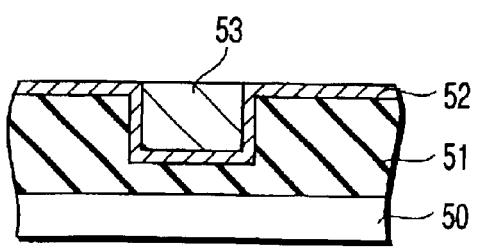
Figure 7C:
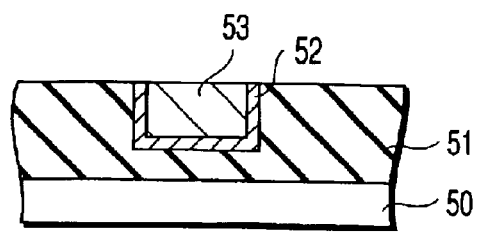

FIGS. 7A to 7C are cross-sectional views collectively showing the process of forming a W damascene wiring.

As shown in FIG. 7A, an insulating film 51 was formed first on a semiconductor substrate 50, followed by forming a groove having a depth of 250 nm in the insulating film 51. Incidentally, it is possible for the semiconductor substrate 50 to be a bulk substrate or an SOI substrate, and an element (not shown) is formed on the semiconductor substrate 50. Then, a TiN liner 52 was deposited on the insulating film 51 to a thickness of 20 nm, followed by depositing a W film 53 on the TiN liner 52 to a thickness of 300 nm. Each of the TiN liner 52 and W film 53 was deposited by a CVD method.

In the next step, the undesired portion of the W film 53 was removed by a CMP process (first polish) so as to expose the surface of the TiN liner 52 to the outside as shown in FIG. 7B. In the CMP process, the TiN liner 52 acts as a stopper so as to make it possible to suppress the erosion.

An alumina dispersion containing 4% by weight of iron nitrate, which is a conventional oxidizing agent, was used as the CMP slurry in the first polish, and the CMP process was carried out for 3 minutes by using the apparatus shown in FIG. 2. Further, the undesired portion of the TiN liner 52 was removed by the same CMP process, except that the CMP slurry according to the second embodiment of the present invention was used for removing the undesired portion of the TiN liner 52.

The CMP slurry according to the second embodiment of the present invention was a dispersion prepared by dispersing colloidal silica particles having a primary particle diameter of 15 nm and zirconia particles having a primary particle diameter of 100 nm in pure water. The concentrations of the colloidal silica particles and the zirconia particles were set at 3% by weight and 0.05% by weight, respectively. When the TiN liner 52 was polished by using this CMP slurry, the polishing rate of the TiN liner was markedly high, i.e., 40 nm/min.

Since the CMP slurry according to the second embodiment of the present invention exhibits a sufficiently high polishing rate as described above, it is possible to form a damascene wiring having a very small width of 0.1 µm.

Incidentally, the TiN polishing rate is 5 nm/min in the case where the dispersion contains silica particles alone, said silica particles having a primary particle diameter of 15 nm, in a concentration of 3% by weight. On the other hand, the TiN polishing rate is lower than 5 nm/min in the case where the dispersion contains zirconia particles alone, said zirconia particles having a primary particle diameter of 100 nm, in a concentration of 0.05% by weight. What should be noted is that it is impossible to obtain a practical polishing rate in the case of using the silica particles or the zirconia particles singly.

Embodiment 2 described above is directed to a CMP slurry containing colloidal silica particles used as the abrasive particles and zirconia particles used as the assist particles. The primary particle diameter and the concentration of each of the abrasive particles and the assist particles are defined in embodiment 2 of the present invention. It has been made possible to form a W damascene wiring low in erosion and free from scratches by removing the TiN liner by the CMP process using the CMP slurry specified in embodiment 2 of the present invention. A similar effect can be obtained also in the case where fumed zirconia particles are used as the assist particles.

The present invention is not limited to the embodiments described above and can be modified in various fashions within the technical scope of the present invention.

For example, it is possible to prepare the CMP slurry of the embodiment of the present invention by adding as required ordinary additives to the dispersion prepared by dispersing in water or the like the abrasive particles and the assist particles described above. The additives include, for example, an oxidizing agent, a surfactant, an oxidization suppressing agent and a pH controlling agent.

The oxidizing agents include, for example, $H_2O_2$, $(NH_4)_2S_2O_8$, $K_2S_2O_8$, iron nitrate, and ammonium cerium nitrate.

The surfactants include, for example, dodecyl sulfonate, dodecylbenzene sulfonate, polyoxyethylene lauryl ether, a fatty acid salt and polyoxyethylene alkyl amine.

Further, the oxidation suppressing agents include, for example, BTA (benzotriazole), and amines having a carboxyl group. Still further, the pH controlling agents include, for example, ammonia water, KOH, nitric acid, citric acid, oxalic acid and succinic acid.

It is possible to mix the additives exemplified above in amounts equal to those in the ordinary preparation of a CMP slurry.

As described above, according to one aspect of the present invention, provided is a CMP slurry, which permits suppressing the defects such as erosion and scratches as much as possible, and which also permits polishing a desired conductive layer such as a metal layer at a sufficiently high polishing rate. Also, according to another aspect of the present invention, provided is a method for manufacturing a semiconductor device comprising a damascene wiring of a high performance.

The present invention can be employed highly effectively for the formation of a damascene wiring made of, for example, Al, Cu or W and mounted in a DRAM or a high-speed logic LSI. It follows that the industrial value of the present invention is very high.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A CMP slurry, comprising a dispersion containing first particles having a primary particle diameter falling within a range of 5 nm to 50 nm and second particles having a primary particle diameter falling within a range of 50 nm to 100 nm, the concentration of said first particles in said dispersion falling within a range of 0.5 to 5% by weight, and the concentration of said second particles in said dispersion falling within a range of 0.01 to 0.1% by weight.

2. The slurry according to claim 1, wherein said first particles are abrasive particles whose particle diameter is decreased during the polishing process, and said second particles are assist particles for decreasing the diameter of said first particles.

3. The slurry according to claim 1, wherein said first particles are selected from the group consisting of colloidal silica particles, colloidal alumina particles, colloidal titanium oxide particles, colloidal ceria particles, and colloidal zirconia particles, and said second particles are selected from the group consisting of ceria particles and zirconia particles.

4. The slurry according to claim 3, wherein said first particles comprise colloidal silica particles and said second particles comprise ceria particles.

5. The slurry according to claim 3, wherein said first particles comprise colloidal silica particles and said second particles comprise zirconia particles.

6. A CMP slurry, comprising a dispersion containing abrasive particles having a primary particle diameter falling within a range of 5 nm to 50 nm and including at least one material selected from the group consisting of colloidal silica, colloidal alumina, colloidal titanium oxide, colloidal ceria and colloidal zirconia, and assist particles having a primary particle diameter falling within a range of 50 nm to 100 nm and including at least one material selected from the group consisting of ceria and zirconia, the concentration of said abrasive particles in said dispersion falling within a range of 0.5 to 5% by weight, and the concentration of said assist particles in said dispersion falling within a range of 0.01 to 0.1% by weight.

7. The slurry according to claim 6, wherein said abrasive particles comprise colloidal silica particles and said assist particles comprise ceria particles.

8. The slurry according to claim 6, wherein said abrasive particles comprise colloidal silica particles and said assist particles comprise zirconia particles.

9. A method for manufacturing a semiconductor device, comprising:
forming an insulating film above a semiconductor substrate;
forming a concave portion in said insulating film;
depositing a conductive material inside said concave portion and on said insulating film so as to form a conductive layer; and
removing said conductive material deposited on said insulating film so as to expose the surface of said insulating film while allowing said conductive material to remain inside said concave portion,
wherein the removal of at least a part of said conductive material deposited on said insulating film is performed by a CMP process using a slurry comprising a dispersion containing first particles having a primary particle diameter falling within a range of 5 nm to 50 nm and second particles having a primary particle diameter falling within a range of 50 nm to 100 nm, the concentration of said first particles in said dispersion falling within a range of 0.5 to 5% by weight, and the concentration of said second particles in said dispersion falling within a range of 0.01 to 0.1% by weight.

10. The method for manufacturing a semiconductor device according to claim 9, wherein said first particles are abrasive particles whose particle diameter is decreased during the polishing treatment, and said second particles are assist particles for decreasing the particle diameter of said first particles.

11. The method for manufacturing a semiconductor device according to claim 9, wherein said first particles are selected from the group consisting of colloidal silica particles, colloidal alumina particles, colloidal titanium oxide particles, colloidal ceria particles and colloidal zirconia particles, and said second particles are selected from the group consisting of ceria particles and zirconia particles.

12. The method for manufacturing a semiconductor device according to claim 9, wherein said conductive layer includes a liner material and a wiring material.

13. The method for manufacturing a semiconductor device according to claim 12, wherein said liner material includes TaN, said first particles comprise colloidal silica particles, and said second particles comprise ceria particles.

14. The method for manufacturing a semiconductor device according to claim 12, wherein said liner material includes TiN, said first particles comprise colloidal silica particles, and said second particles comprise zirconia particles.

15. The method for manufacturing a semiconductor device according to claim 9, wherein said conductive layer is of a single layer structure or a laminate structure and contains Cu, Al, W, Ti, Mo, Nb, Ta, V, Ru, Ag, an alloy, a nitride, a boride or an oxide, each of said alloy, nitride, boride and oxide containing one of said metals as a main component.

16. A method for manufacturing a semiconductor device, comprising:

forming an insulating film above a semiconductor substrate;

forming a concave portion in said insulating film;

depositing a conductive material inside said concave portion and on said insulating film so as to form a conductive layer; and removing said conductive material deposited on said insulating film so as to expose the surface of said insulating film while allowing said conductive material to remain inside said concave portion, wherein the removal of at least a part of said conductive material deposited on said insulating film is performed by a CMP process using a slurry comprising a dispersion containing abrasive particles having a primary particle diameter falling within a range of 5 nm to 50 nm and including at least one material selected from the group consisting of colloidal silica, colloidal alumina, colloidal titanium oxide, colloidal ceria and colloidal zirconia, and assist particles having a primary particle diameter falling within a range of 50 nm to 100 nm and including at least one material selected from the group consisting of ceria and zirconia, the concentration of said abrasive particles in said dispersion falling within a range of 0.5 to 5% by weight, and the concentration of said assist particles in said dispersion falling within a range of 0.01 to 0.1% by weight.

17. The method for manufacturing a semiconductor device according to claim 16, wherein said conductive layer includes a liner material and a wiring material.

18. The method for manufacturing a semiconductor device according to claim 17, wherein said liner material includes TaN, said first particles comprise colloidal silica particles, and said second particles comprise ceria particles.

19. The method for manufacturing a semiconductor device according to claim 17, wherein said liner material includes TiN, said first particles comprise colloidal silica particles, and said second particles comprise zirconia particles.

20. The method for manufacturing a semiconductor device according to claim 16, wherein said conductive layer is of a single layer structure or a laminate structure and contains Cu, Al, W, Ti, Mo, Nb, Ta, V, Ru, Ag, an alloy, a nitride, a boride or an oxide, each of said alloy, nitride, boride and oxide containing one of said metals as a main component.

* * * * *